(12) United States Patent
Kim et al.

(10) Patent No.: US 12,525,548 B2
(45) Date of Patent: Jan. 13, 2026

(54) SEMICONDUCTOR PACKAGE INCLUDING STIFFENER

(71) Applicant: SAMSUNG ELECTRONICS CO., LTD., Suwon-si (KR)

(72) Inventors: Jongyoun Kim, Seoul (KR); Eungkyu Kim, Yongin-si (KR); Inhyung Song, Cheonan-si (KR); Hyeonseok Lee, Pyeongtaek-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 496 days.

(21) Appl. No.: 17/680,815

(22) Filed: Feb. 25, 2022

(65) Prior Publication Data
US 2023/0046098 A1    Feb. 16, 2023

(30) Foreign Application Priority Data

Aug. 13, 2021    (KR) .......................... 10-2021-0107253

(51) Int. Cl.
*H01L 23/00* (2006.01)
*H01L 25/16* (2023.01)
(Continued)

(52) U.S. Cl.
CPC ............ *H01L 23/562* (2013.01); *H01L 25/16* (2013.01); *H01L 25/165* (2013.01);
(Continued)

(58) Field of Classification Search
CPC . H01L 23/562; H01L 23/49822; H01L 25/16; H01L 23/3185; H01L 23/34; H01L 23/5385; H01L 25/0655; H01L 25/18; H01L 25/165; H10B 80/00; H10K 39/10; H10K 39/12; H10K 39/15; H10K 39/18; H10K 39/601; H10K 39/621; H10K 59/90;
(Continued)

(56) References Cited

U.S. PATENT DOCUMENTS 9,899,305 B1    2/2018 Yeh et al.
2004/0195667 A1    10/2004 Karnezos
(Continued)

FOREIGN PATENT DOCUMENTS

JP    2001210778 A    8/2001
KR    10-2016-0057780 A    5/2016

OTHER PUBLICATIONS

Modeling and Design of 2.5D Package with Mitigated Warpage and Enhanced Thermo-Mechanical Reliability, 2018 IEEE 68th Electronic Components and Technology Conference (ECTC), San Diego, CA, USA, 2018, pp. 2477-2483 (Year: 2018).*

*Primary Examiner* — Ratisha Mehta
*Assistant Examiner* — Brad A Knudson
(74) *Attorney, Agent, or Firm* — Wolf, Greenfield & Sacks, P.C.

(57) ABSTRACT

A semiconductor package includes a package substrate, a semiconductor stack on the package substrate, a passive device on the package substrate and spaced apart from the semiconductor stack, and a stiffener on the package substrate and extending around an outer side of the semiconductor stack. The stiffener includes a first step surface extends over the passive device. A width of a bottom surface of the stiffener is smaller than a width of a top surface of the stiffener.

20 Claims, 7 Drawing Sheets

(51) Int. Cl.
    *H01L 23/31*      (2006.01)
    *H01L 23/34*      (2006.01)
    *H01L 23/538*     (2006.01)
    *H01L 25/065*     (2023.01)
    *H01L 25/18*      (2023.01)

(52) U.S. Cl.
    CPC .......... *H01L 23/3185* (2013.01); *H01L 23/34* (2013.01); *H01L 23/5385* (2013.01); *H01L 25/0655* (2013.01); *H01L 25/18* (2013.01); *H01L 2224/16195* (2013.01)

(58) Field of Classification Search
    CPC ........ H10K 59/95; H10N 19/00; H10N 39/00; H10N 59/00; H10N 69/00; H10N 79/00; H10N 89/00
    See application file for complete search history.

(56) References Cited

U.S. PATENT DOCUMENTS

| | | | |
|---|---|---|---|
| 2017/0372979 A1* | 12/2017 | Gandhi | H01L 23/3675 |
| 2018/0233459 A1 | 8/2018 | Fushimi | |
| 2018/0358280 A1* | 12/2018 | Gandhi | H01L 23/04 |
| 2019/0115269 A1* | 4/2019 | Pan | H01L 23/04 |
| 2019/0273030 A1* | 9/2019 | Lim | H01L 23/3675 |
| 2020/0152546 A1* | 5/2020 | Refai-Ahmed | H01L 23/481 |
| 2020/0258807 A1 | 8/2020 | Kao et al. | |
| 2021/0151388 A1 | 5/2021 | Choi et al. | |
| 2021/0217682 A1* | 7/2021 | Chiu | H01L 23/40 |
| 2022/0310502 A1* | 9/2022 | Chen | H01L 23/562 |
| 2022/0359322 A1* | 11/2022 | Hung | H01L 21/56 |

\* cited by examiner

SEMICONDUCTOR PACKAGE INCLUDING STIFFENER

CROSS-REFERENCE TO THE RELATED APPLICATION

This application claims priority from Korean Patent Application No. 10-2021-0107253, filed on Aug. 13, 2021, in the Korean Intellectual Property Office, the disclosure of which is incorporated herein by reference in its entirety.

BACKGROUND

1. Field

The example embodiments of the disclosure relate to a semiconductor package including a stiffener capable of effectively controlling warpage.

2. Description of the Related Art

As the demand for compact, multifunctional electronic devices has increased, the demand for thin, lightweight semiconductor packages has also increased. Unfortunately, thin semiconductor packages may be susceptible to warpage. In order to prevent warpage, a stiffener may be attached to a substrate of a semiconductor package.

A 2.5D package has a structure in which a molded interposer package (MIP) is disposed on a printed circuit board. In a 2.5D package, warpage may occur due to a coefficient of thermal expansion difference between the printed circuit board, which includes a core and copper, and the molded interposer package (MIP), which mainly includes silicon.

SUMMARY

The example embodiments of the disclosure provide a semiconductor package capable of effectively controlling warpage.

A semiconductor package according to an example embodiment of the disclosure may include a package substrate, a semiconductor stack on the package substrate, a passive device on the package substrate and spaced apart from the semiconductor stack, and a stiffener on the package substrate, wherein the stiffener extends around an outer side of the semiconductor stack. The stiffener may include a first step surface extending over the passive device. A width of a bottom surface of the stiffener may be smaller than a width of a top surface of the stiffener.

A semiconductor package according to an example embodiment of the disclosure may include a package substrate, a semiconductor stack including an interposer substrate on the package substrate, semiconductor chips on the interposer substrate, and a mold layer extending around an outer side of the semiconductor chips, a passive device on the package substrate and spaced apart from the semiconductor stack, a stiffener on the package substrate, wherein the stiffener extends around an outer side of the semiconductor stack, and a thermal interface material (TIM) between the package substrate and the stiffener. The stiffener may include a first step surface extending over the passive device. A width of a bottom surface of the stiffener may be smaller than a width of a top surface of the stiffener.

A semiconductor package according to an example embodiment of the disclosure may include a package substrate, a semiconductor stack including an interposer substrate on the package substrate, semiconductor chips on the interposer substrate, and a mold layer extending around an outer side of the semiconductor chips, a passive device on the package substrate and spaced apart from the semiconductor stack, a stiffener on the package substrate, wherein the stiffener extends around an outer side of the semiconductor stack, and a thermal interface material (TIM) between the package substrate and the stiffener. The stiffener may include an inclined surface extending over the passive device. A portion of the stiffener gradually increases in width in a direction upward from a bottom surface of the stiffener.

DETAILED DESCRIPTION OF EXAMPLE EMBODIMENTS

Figure 1:
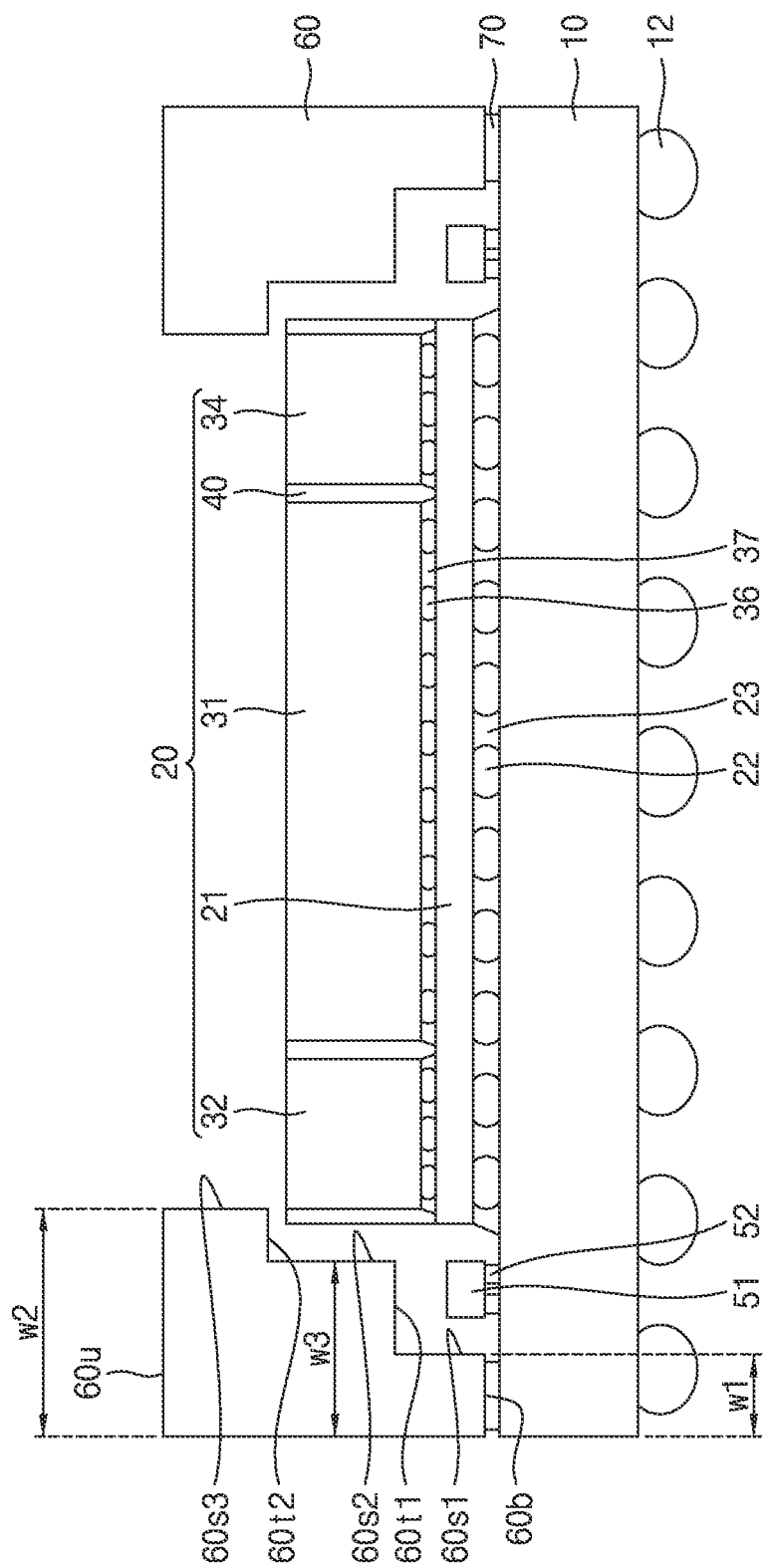
FIG. 1 is a cross-sectional view of a semiconductor package according to an example embodiment of the disclosure.
Figure 2:
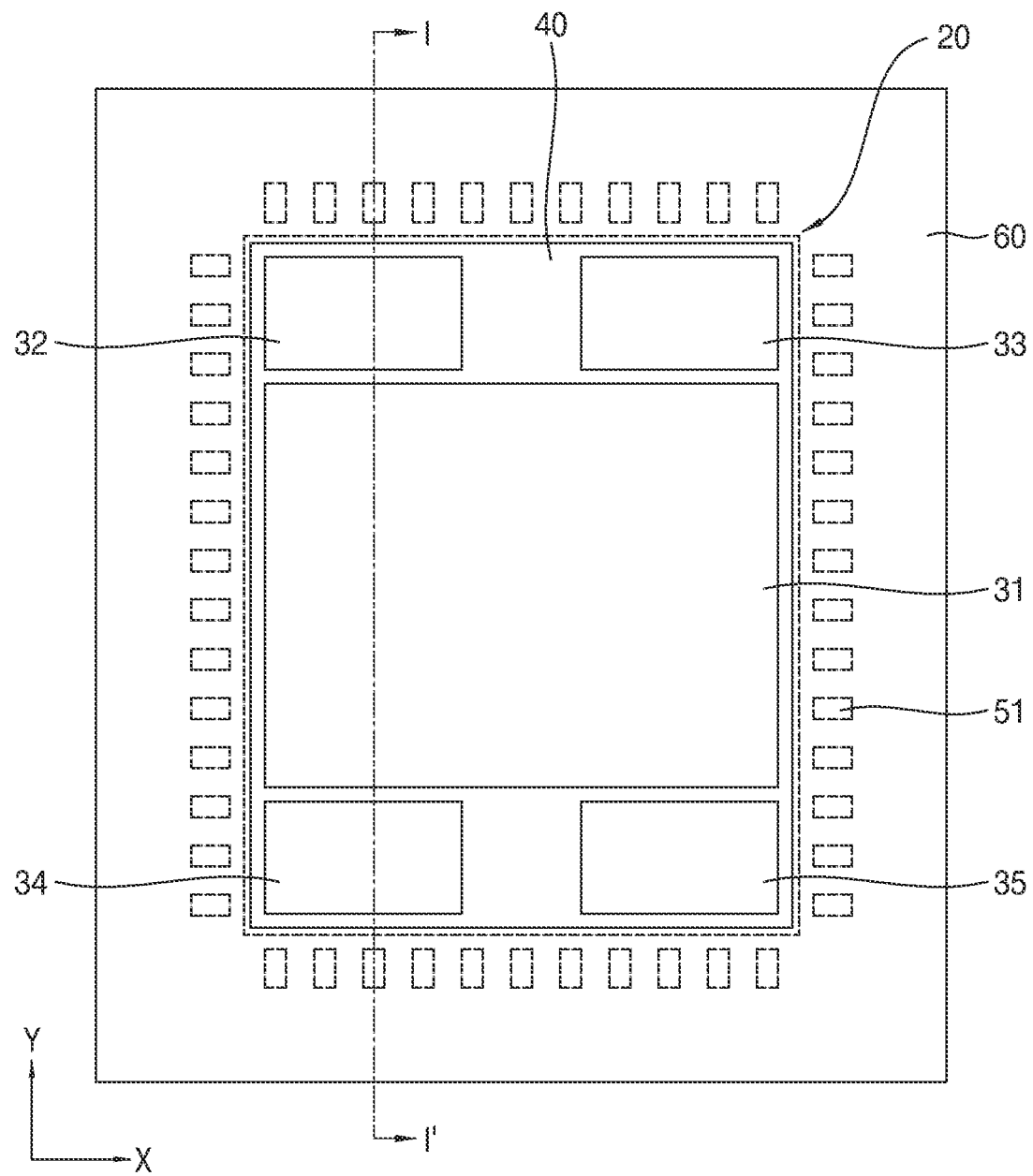
FIG. 2 is a plan view of the semiconductor package according to the example embodiment of the disclosure.

FIG. 1 is a cross-sectional view of a semiconductor package according to an example embodiment of the disclosure. FIG. 2 is a plan view of the semiconductor package according to the example embodiment of the disclosure. FIG. 1 is a cross-sectional view taken along line I-I' in FIG. 2.

Referring to FIGS. 1 and 2, the semiconductor package may include a package substrate 10, a semiconductor stack 20, passive devices 51, and a stiffener 60.

The package substrate 10 may electrically connect the semiconductor stack 20 to an external circuit. The package substrate 10 may be, for example, a printed circuit board (PCB). The package substrate 10 may include a substrate base, and an upper pad and a lower pad which are formed at a top surface and a bottom surface of the substrate base, respectively. The upper pad and the lower pad may be exposed by solder resist layers covering the top surface and the bottom surface of the substrate base, respectively. Outer connecting terminals 12 may be disposed on the bottom surface of the package substrate 10. The outer connecting terminals 12 may be connected to the lower pad. For example, each of the outer connecting terminals 12 may be a solder ball.

The semiconductor stack 20 may be disposed on the package substrate 10. The semiconductor stack 20 may be centrally disposed on the package substrate 10. The semiconductor stack 20 may include an interposer substrate 21, semiconductor chips 31, 32, 33, 34 and 35, and a mold layer 40.

The interposer substrate 21 may be disposed on the package substrate 10. The interposer substrate 21 may electrically interconnect the package substrate 10 and the semiconductor chips 31, 32, 33, 34 and 35. The interposer substrate 21 may electrically interconnect the semiconductor chips 31, 32, 33, 34 and 35 on the interposer substrate 21. The interposer substrate 21 may include a substrate base made of a semiconductor material, and an upper pad and a lower pad which are formed at a top surface and a bottom surface of the substrate base, respectively. For example, the substrate base may be formed of a silicon wafer or a glass substrate. An inner wiring may be formed at a top surface, a bottom surface and/or an inner portion of the substrate base. Through vias, which electrically interconnect the upper pad and the lower pad, may be formed at the inner portion of the substrate base. The interposer substrate 21 may be mounted on the package substrate 10 via first connecting terminals 22 disposed between the package substrate 10 and the interposer substrate 21. For example, each of the first connecting terminals 22 may be a solder ball. A first adhesive layer 23 surrounding the first connecting terminals 22 may be further disposed between the interposer substrate 21 and the package substrate 10. For example, the first adhesive layer 23 may be an underfill material such as an epoxy resin, an insulating polymer, a non-conductive film (NCF), etc.

The semiconductor chips 31, 32, 33, 34 and 35 may be disposed on the interposer substrate 21. In an embodiment, the semiconductor chips 31, 32, 33, 34 and 35 may include a first semiconductor chip 31, a second semiconductor chip 32, a third semiconductor chip 33, a fourth semiconductor chip 34, and a fifth semiconductor chip 35. The first to fifth semiconductor chips 31 to 35 may be semiconductor chips performing specific functions, respectively. For example, the first semiconductor chip 31 may be a semiconductor chip performing a logic function of a memory device. The second to fifth semiconductor chips 32 to 35 may be semiconductor chips performing a storage function of a memory device. For example, each of the second to fifth semiconductor chips 32 to 35 may be a high bandwidth memory (HBM) in which a plurality of inner semiconductor chips each including a through electrode is vertically stacked.

The first to fifth semiconductor chips 31 to 35 may be spaced apart from one another. The second semiconductor chip 32 and the third semiconductor chip 33 may be disposed at one side of the first semiconductor chip 31. The second semiconductor chip 32 and the third semiconductor chip 33 may be spaced apart from each other in a first direction (an X direction). Each of the second semiconductor chip 32 and the third semiconductor chip 33 may be spaced apart from the first semiconductor chip 31 in a second direction (a Y direction). The fourth semiconductor chip 34 and the fifth semiconductor chip 35 may be disposed at the other side of the first semiconductor chip 31. The fourth semiconductor chip 34 and the fifth semiconductor chip 35 may be spaced apart from each other in the first direction (the X direction). Each of the fourth semiconductor chip 34 and the fifth semiconductor chip 35 may be spaced apart from the first semiconductor chip 31 in the second direction (the Y direction). The first semiconductor chip 31 may be disposed between the second semiconductor chip 32 and the fourth semiconductor chip 34. The first semiconductor chip 31 may also be disposed between the third semiconductor chip 33 and the fifth semiconductor chip 35. Although the semiconductor stack 20 is shown in the drawings as including five semiconductor chips, the example embodiments of the disclosure are not limited thereto.

The semiconductor chips 31, 32, 33, 34 and 35 may be mounted on the interposer substrate 21 via second connecting terminals 36. For example, each of the second connecting terminals 36 may be a solder ball. A second adhesive layer 37 may be disposed between the interposer substrate 21 and the semiconductor chips 31, 32, 33, 34 and 35. The second adhesive layer 37 may surround the second connecting terminals 36. For example, the second adhesive layer 37 may be an underfill material such as an epoxy resin, an insulating polymer, a non-conductive film (NCF), etc.

The mold layer 40 may surround (i.e., extend around an outer side of) the semiconductor chips 31, 32, 33, 34 and 35 on the interposer substrate 21, as illustrated. The mold layer 40 may cover the second adhesive layer 37. The mold layer 40 may cover a portion of atop surface of the interposer substrate 21. Atop surface of the mold layer 40 may be coplanar with top surfaces of the semiconductor chips 31, 32, 33, 34 and 35. In an embodiment, the mold layer 40 may cover the top surfaces of the semiconductor chips 31, 32, 33, 34 and 35. For example, the mold layer 40 may include an epoxy molding compound.

The passive devices 51 may be disposed on the package substrate 10. The passive devices 51 may function to enhance electrical characteristics in an electric power supply procedure of the semiconductor package. For example, the passive devices 51 may include one of a capacitor, a resistor, and an inductor. Otherwise, the passive device 51 may be an integrated passive device (IPD) in which a resistor, an inductor, and a capacitor are integrated, a single-layer capacitor (SLC), a capacitor array, etc. For example, the passive devices 51 may be mounted on the package substrate 10 in the type of a surface mounted device (SMD).

The passive devices 51 may be disposed to be spaced apart from the semiconductor stack 20. The passive devices 51 may be disposed adjacent to the semiconductor stack 20. The passive devices 51 may be arranged along a side surface of the semiconductor stack 20. The passive devices 51 may be disposed to surround the semiconductor stack 20 in plan view (i.e., the passive devices 51 extend around an outer side of the semiconductor stack 20). In an embodiment, the passive devices 51 may be disposed not to be adjacent to at least one of four side surfaces of the semiconductor stack 20 in plan view. The passive devices 51 may be mounted on the package substrate 10 via a solder paste 52. The level of top surfaces of the passive devices 51 may be lower than the level of a top surface of the semiconductor stack 20 with reference to a top surface of the package substrate 10.

The stiffener 60 may be disposed on the package substrate 10. The stiffener 60 may include copper (Cu), without being limited thereto. The stiffener 60 may have a quadrangular ring shape in plan view. The stiffener 60 may extend along a periphery of the package substrate 10. The stiffener 60 may extend along a periphery of the semiconductor stack 20. The stiffener 60 may surround (i.e., extend around an outer side of) the semiconductor stack 20. The stiffener 60 may be open at a top side thereof and, as such, may expose the top surface of the semiconductor stack 20. The stiffener 60 may be spaced apart from the semiconductor stack 20 and the passive devices 51.

The stiffener 60 may include a staircase structure, as illustrated in FIG. 1. The stiffener 60 may include a first vertical surface 60$s$1 and a first step surface 60$t$1. The first vertical surface 60$s$1 may be perpendicular to the top surface of the package substrate 10. The first step surface 60$t$1 may be perpendicular to the first vertical surface 60$s$1. The first step surface 60$t$1 may be parallel to the top surface of the package substrate 10. The first vertical surface 60$s$1 may extend from a bottom surface 60b of the stiffener 60 to the first step surface 60t1. The first step surface 60t1 may be connected to an upper end of the first vertical surface 60s1. The first step surface 60t1 may be disposed nearer to the semiconductor stack 20 than the bottom surface 60b of the stiffener 60. The first step surface 60t1 may vertically overlap with (i.e., extend over) at least a part of the passive devices 51. The first step surface 60t1 may be disposed at a level higher than upper ends of the passive devices 51, but lower than the top surface of the semiconductor stack 20.

The stiffener 60 may include a second vertical surface 60s2 and a second step surface 60t2. The second vertical surface 60s2 and the second step surface 60t2 may be disposed at a higher level than the first step surface 60t1. The second vertical surface 60s2 may be directly connected to the first step surface 60t1. The second vertical surface 60s2 may be perpendicular to the top surface of the package substrate 10. The second vertical surface 60s2 may be perpendicular to the first step surface 60t1. The second vertical surface 60s2 may extend from the first step surface 60t1 to the second step surface 60t2. The second vertical surface 60s2 may be disposed nearer to the semiconductor stack 20 than the first vertical surface 60s1. The level of an upper end of the second vertical surface 60s2 may be higher than the level of the top surface of the semiconductor stack 20 with reference to the top surface of the package substrate 10.

The second step surface 60t2 may be connected to the upper end of the second vertical surface 60s2. The second step surface 60t2 may be perpendicular to the second vertical surface 60s2. The second step surface 60t2 may be parallel to the top surface of the package substrate 10. In plan view, the second step surface 60t2 may be disposed nearer to the semiconductor stack 20 than the first step surface 60t1. The second step surface 60t2 may be disposed at a higher level than the top surface of the semiconductor stack 20 with reference to the top surface of the package substrate 10. The second step surface 60t2 may be spaced apart from the semiconductor stack 20. A portion of the second step surface 60t2 may vertically overlap with (i.e., extend over) a portion of the semiconductor stack 20. In an embodiment, the second step surface 60t2 may not vertically overlap with (i.e., may not extend over) the semiconductor stack 20. The stiffener 60 may include a third vertical surface 60s3, and the third vertical surface 60s3 may extend from the second step surface 60t2 to a top surface 60u of the stiffener 60.

In an embodiment, a first minimum width w1 of the bottom surface 60b of the stiffener 60 may be smaller than a second minimum width w2 of the top surface 60u of the stiffener 60. The first minimum width w1 of the bottom surface 60b of the stiffener 60 may correspond to the minimum distance between an outer side surface of the stiffener 60 and the first vertical surface 60s1. The second minimum width w2 of the top surface 60u of the stiffener 60 may correspond to the minimum distance between the outer side surface of the stiffener 60 and the third vertical surface 60s3. For example, the second minimum width w2 of the top surface 60u of the stiffener 60 may be about 1.5 to 5 times the first minimum width w1 of the bottom surface 60b of the stiffener 60. Preferably, the second minimum width w2 of the top surface 60u of the stiffener 60 may be about 2 to 5 times the first minimum width w1 of the bottom surface 60b of the stiffener 60. A minimum width w3 of a middle portion of the stiffener 60 may be greater than the first minimum width w1, but smaller than the second minimum width w2. The middle portion of the stiffener 60 may comprise a portion of the stiffener 60 that is disposed at a level higher than the first step surface 60t1, but lower than the second step surface 60t2. The third minimum width w3 may correspond to the minimum distance between the outer side surface of the stiffener 60 and the second vertical surface 60s2.

The semiconductor package may include a thermal interface material (TIM) 70. The TIM 70 may be disposed between the package substrate 10 and the stiffener 60. The TIM 70 may be interposed between the bottom surface 60b of the stiffener 60 and the top surface of the package substrate 10. The stiffener 60 may be mounted on the package substrate 10 via the TIM 70. For example, the TIM 70 may include an epoxy resin. For example, the TIM 70 may be mineral oil, grease, a gap filler putty, a phase change gel, phase change material pads, or a particle-filled epoxy. The TIM 70 may be substituted by an adhesive material layer.

Figure 3:
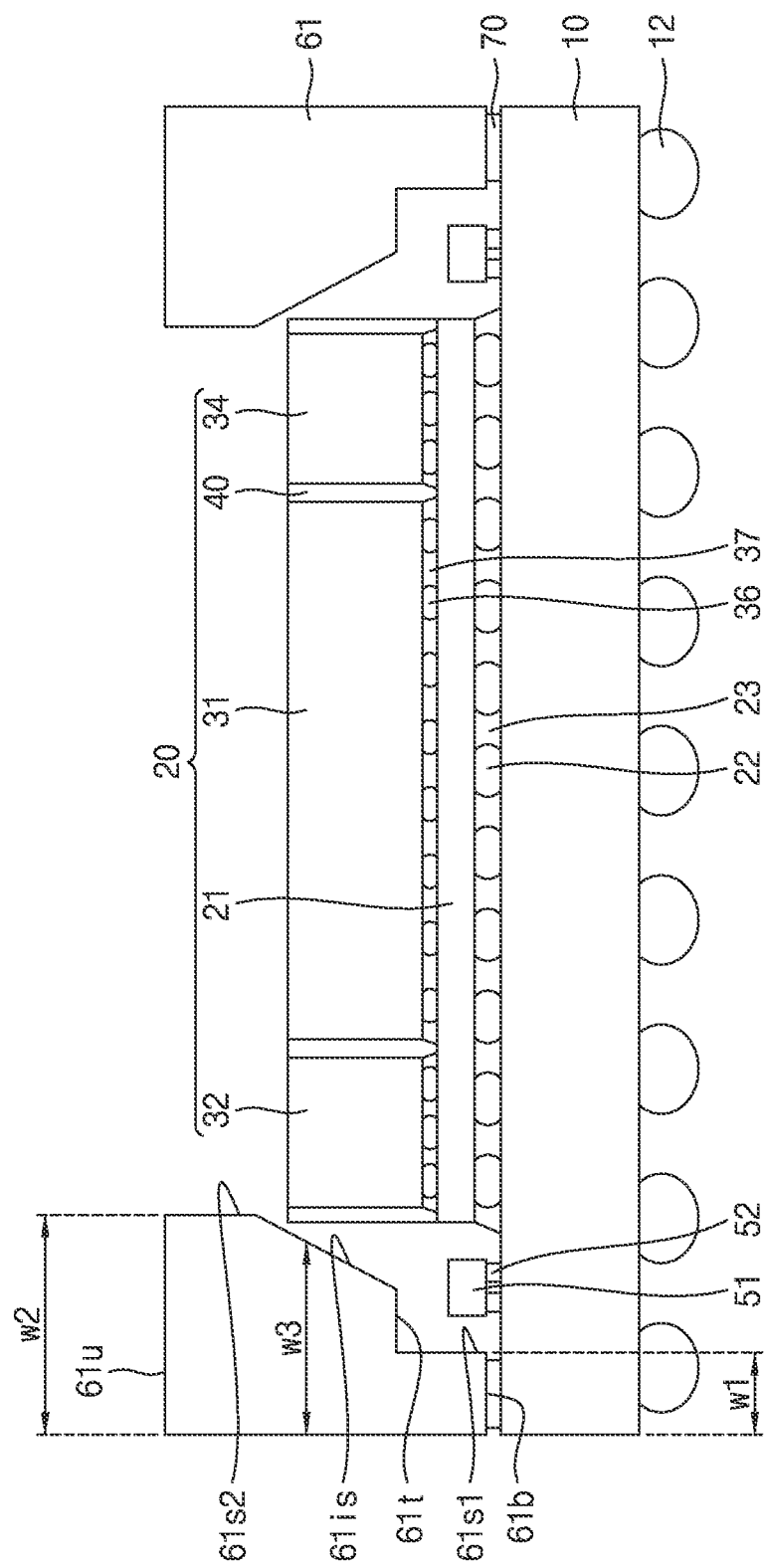
FIG. 3 is a cross-sectional view of a semiconductor package according to an example embodiment of the disclosure.

FIG. 3 is a cross-sectional view of a semiconductor package according to an example embodiment of the disclosure.

Referring to FIG. 3, a stiffener 61 may include a staircase structure. The staircase structure of the stiffener 61 may include a first vertical surface 61s1 and a step surface 61t. The step surface 61t may be disposed on a passive device 51. The step surface 61t may vertically overlap with (i.e., extend over) the passive device 51. The step surface 61t may be vertically spaced apart from the passive device 51. The step surface 61t may be disposed at a level higher than an upper surface of the passive device 51, but lower than a top surface of a semiconductor stack 20 with reference to a top surface of a package substrate 10.

The stiffener 61 may include an inclined surface 61is connected to the step surface 61t, and a second vertical surface 61s2 connected to a top surface 61u of the stiffener 61. The inclined surface 61is may extend from the step surface 61t to the second vertical surface 61s2. The inclined surface 61is and the second vertical surface 61s2 may be disposed at a higher level than the step surface 61t with reference to the top surface of the package substrate 10. The inclined surface 61is may have an inclination with respect to the top surface of the package substrate 10. The inclined surface 61is may have an inclination with respect to the step surface 61t. An angle formed by the inclined surface 61is with respect to the top surface of the package substrate 10 or the step surface 61t may be an acute angle. An upper end of the inclined surface 61is may be disposed at a higher level than the top surface of the semiconductor stack 20 with reference to the top surface of the package substrate 10. The inclined surface 61is may be gradually nearer to the semiconductor stack 20 as the incline surface 61is extends upwards from a lower level than the top surface of the semiconductor stack 20. The inclined surface 61is may be gradually farther from the semiconductor stack 20 as the inclined surface 61is extends upwards from a higher level than the top surface of the semiconductor stack 20. At least a portion of the inclined surface 61is may vertically overlap with (i.e., extend over) a portion of the passive device 51. A portion of the inclined surface 61is may vertically overlap with (i.e., extend over) a portion of the semiconductor stack 20.

A first minimum width w1 of a bottom surface 61b of the stiffener 61 may be smaller than a second minimum width w2 of the top surface 61u of the stiffener 61. A third minimum width w3 of a middle portion of the stiffener 61 may gradually increase as the middle portion of the stiffener 61 extends upwards with reference to the top surface of the package substrate 10. The middle portion of the stiffener 61 may be a portion of the stiffener 61 disposed at a level higher than the step surface 61t, but lower than the second vertical surface 61s2.

Figure 4:
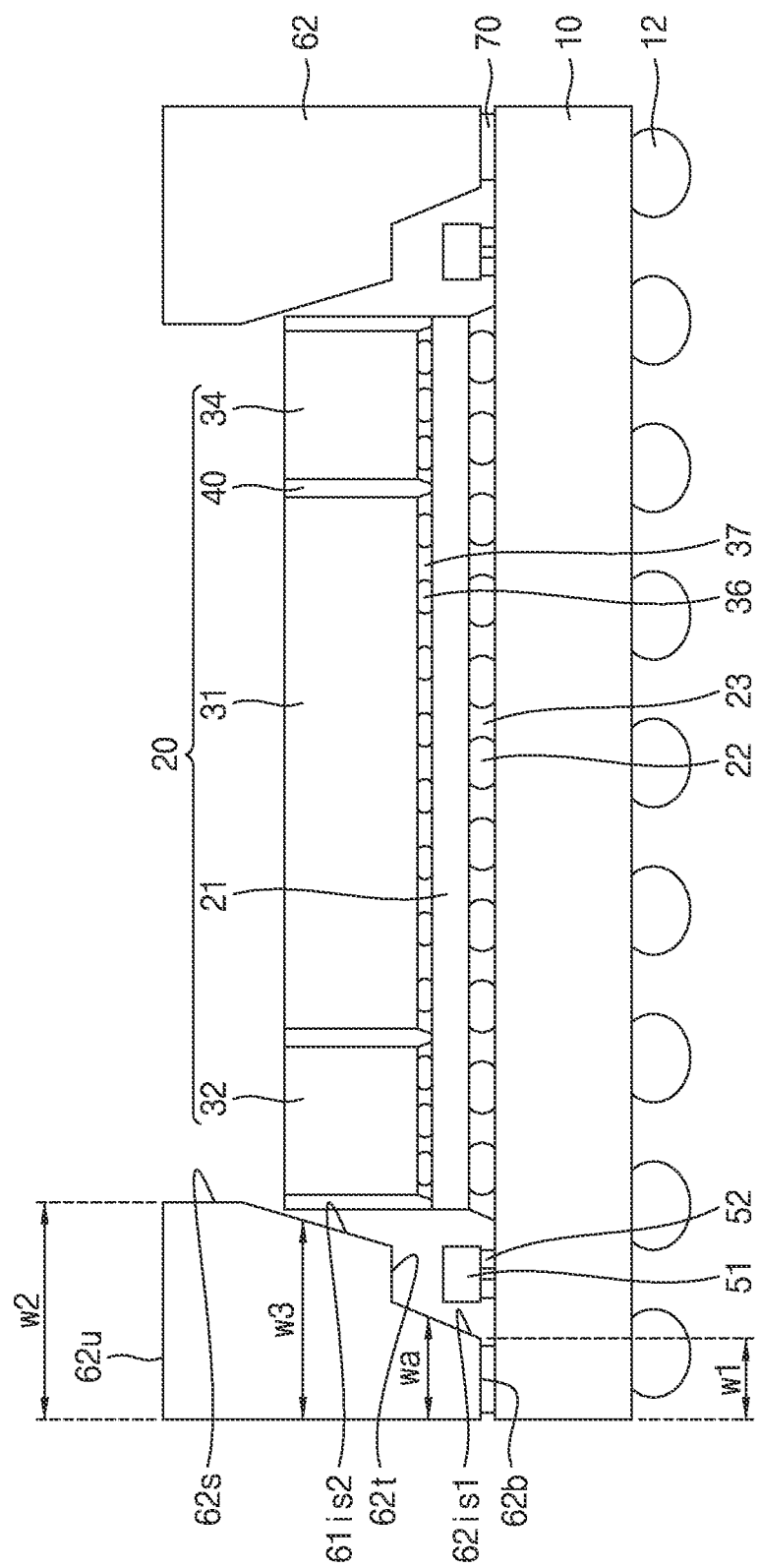
FIG. 4 is a cross-sectional view of a semiconductor package according to an example embodiment of the disclosure.

FIG. 4 is a cross-sectional view of a semiconductor package according to an example embodiment of the disclosure.

Referring to FIG. 4, a stiffener 62 may include a first inclined surface 62is1, a step surface 62t, a second inclined surface 62is2, and a vertical surface 62s. The step surface 62t may be disposed on a passive device 51, and may vertically overlap with (i.e., extend over) the passive device 51. The first inclined surface 62is1 may extend from a bottom surface 62b of the stiffener 62 to the step surface 62t. The first inclined surface 62is1 may have an inclination with respect to a top surface of a package substrate 10 and the bottom surface 62b of the stiffener 62. An angle formed by the first inclined surface 62is1 with respect to the top surface of the package substrate 10 and the bottom surface 62b of the stiffener 62 may be an acute angle. The first inclined surface 62is1 may be nearer to a semiconductor stack 20 as the first inclined surface 62is1 extends upwards. A portion of the first inclined surface 62is1 may vertically overlap with (i.e., extend over) a portion of the passive device 51.

The vertical surface 62s may be connected to a top surface 62u of the stiffener 62, and the second inclined surface 62is2 may extend from the step surface 62t to the vertical surface 62s. The second inclined surface 62is2 may have an inclination with respect to the top surface of the package substrate 10 and the step surface 62t. An angle formed by the second inclined surface 62is2 with respect to the top surface of the package substrate 10 and the step surface 62t may be an acute angle. The angle formed by the second inclined surface 62is2 with respect to the top surface of the package substrate 10 may be equal to or different from the angle formed by the first inclined surface 62is1 with respect to the top surface of the package substrate 10. An upper end of the second inclined surface 62is2 may be disposed at a higher level than a top surface of the semiconductor stack 20 with reference to the top surface of the package substrate 10. A portion of the second inclined surface 62is2 may vertically overlap with (i.e., extend over) a portion of the semiconductor stack 20.

A minimum width wa of a lower portion of the stiffener 62 may gradually increase as the lower portion of the stiffener 62 extends upwards with reference to the top surface of the package substrate 10. The lower portion of the stiffener 62 may be a portion of the stiffener 62 disposed at a lower level than the step surface 62t.

Figure 5:
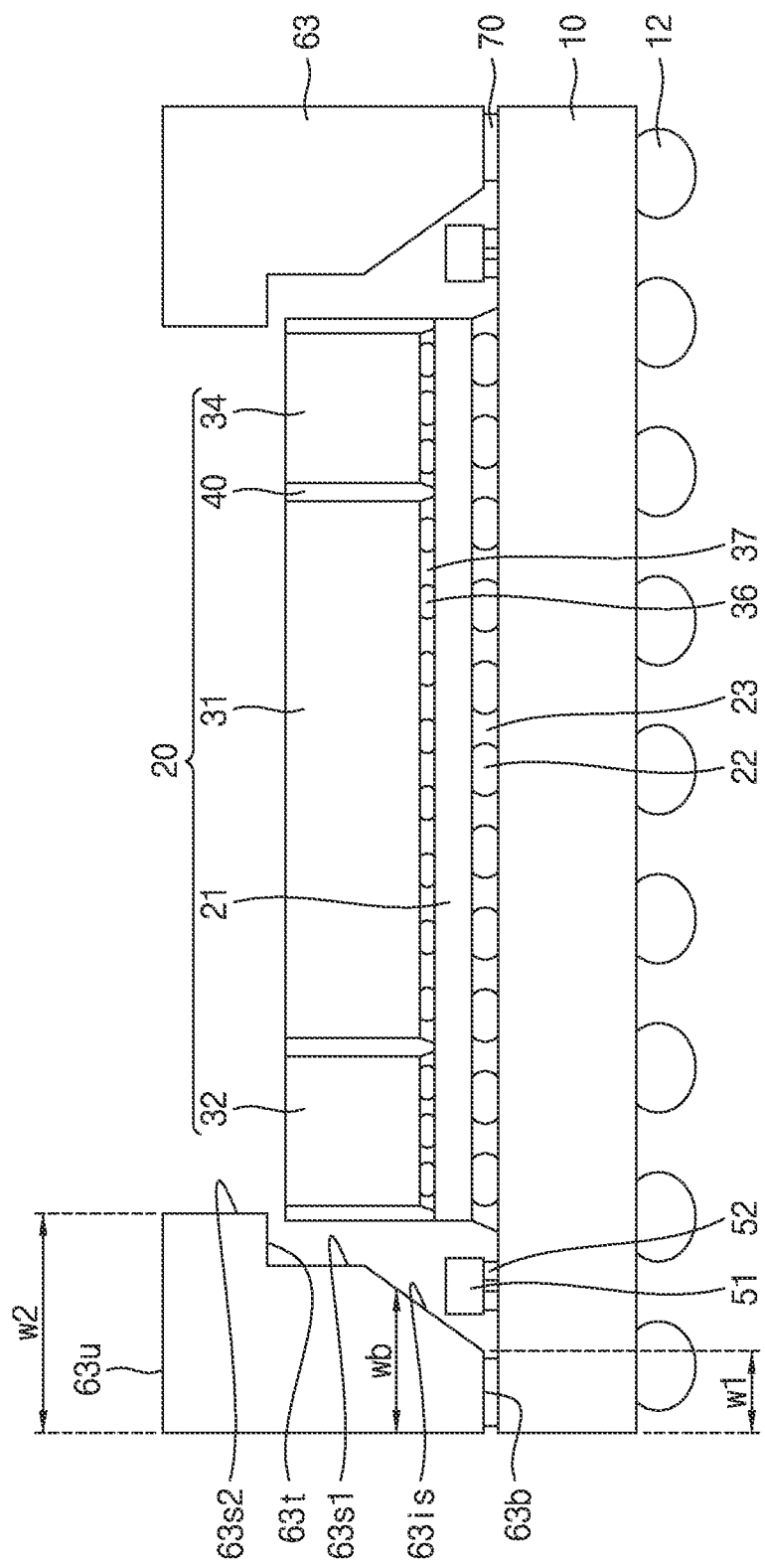
FIG. 5 is a cross-sectional view of a semiconductor package according to an example embodiment of the disclosure.

FIG. 5 is a cross-sectional view of a semiconductor package according to an example embodiment of the disclosure.

Referring to FIG. 5, a stiffener 63 may include an inclined surface 63is, a first vertical surface 63s1, a step surface 63t, and a second vertical surface 63s2. The inclined surface 63is may be connected to a bottom surface 63b of the stiffener 63. The inclined surface 63is may have an inclination with respect to a top surface of the package substrate 10 and the bottom surface 63b of the stiffener 63. The inclined surface 63is may extend from the bottom surface 63b of the stiffener 63 to a point over the passive device 51. A portion of the inclined surface 63is may vertically overlap with (i.e., extend over) at least a portion of the passive device 51.

The first vertical surface 63s1, the step surface 63t, and the second vertical surface 63s2 may be disposed above the inclined surface 63is. The first vertical surface 63s1 may be connected to an upper end of the inclined surface 63is, and the second vertical surface 63s2 may be connected to a top surface 63u of the stiffener 63. The step surface 63t may extend from the first vertical surface 63s1 to the second vertical surface 63s2. A staircase structure may be formed by the first vertical surface 63s1 and the step surface 63t. The first vertical surface 63s1 may be perpendicular to a top surface of the package substrate 10. An upper end of the first vertical surface 63s1 may be disposed at a higher level than a top surface of a semiconductor stack 20. The step surface 63t may be connected to the upper end of the first vertical surface 63s1. The step surface 63t may be disposed at a higher level than the top surface of the semiconductor stack 20. The step surface 63t may be parallel to the top surface of the package substrate 10. A portion of the step surface 63t may vertically overlap with (i.e., extend over) a portion of the semiconductor stack 20. The second vertical surface 63s2 may extend from the step surface 63t to a top surface 63s of the stiffener 63.

A minimum width wb of a lower portion of the stiffener 63 may gradually increase as the lower portion of the stiffener 63 extends upwards with reference to the top surface of the package substrate 10. The lower portion of the stiffener 63 may be a portion of the stiffener 63 disposed at a lower level than the inclined surface 63is.

Figure 6:
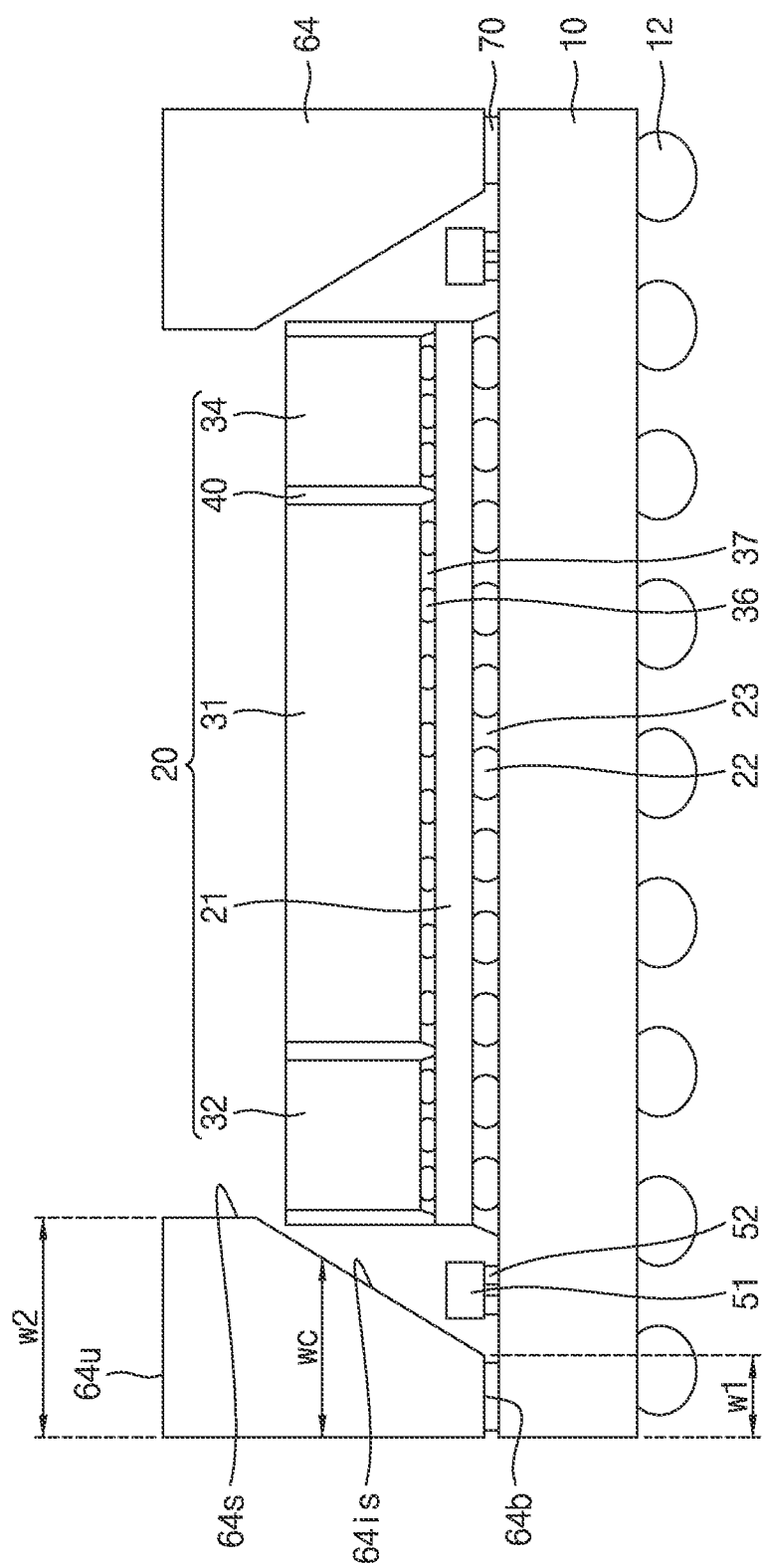
FIG. 6 is a cross-sectional view of a semiconductor package according to an example embodiment of the disclosure.

FIG. 6 is a cross-sectional view of a semiconductor package according to an example embodiment of the disclosure.

Referring to FIG. 6, a stiffener 64 may include an inclined surface 64is and a vertical surface 64s. The inclined surface 64is may be connected to a bottom surface 64b of the stiffener 64, and the vertical surface 64s may be connected to a top surface 64u of the stiffener 64. The inclined surface 64is may extend from the bottom surface 64b of the stiffener 64 to the vertical surface 64s. The inclined surface 64is may have an inclination with respect to a top surface of a package substrate 10 and the bottom surface 64b of the stiffener 64. An angle formed by the inclined surface 64is with respect to the top surface of the package substrate 10 and the bottom surface 64b of the stiffener 64 may be an acute angle. The inclined surface 64is may vertically overlap with (i.e., extend over) a passive device 51. An upper end of the inclined surface 64is may be disposed at a higher level than a top surface of a semiconductor stack 20 with reference to the top surface of the package substrate 10. A portion of the inclined surface 64is may vertically overlap with (i.e., extend over) a portion of the semiconductor stack 20.

A first minimum width w1 of the bottom surface 64b of the stiffener 64 may be smaller than a second minimum width w2 of the top surface 64u of the stiffener 64. A minimum width wc of the stiffener 64 may gradually increase as the stiffener 64 extends upwards from a lower level than the upper end of the inclined surface 64is with reference to the top surface of the package substrate 10.

Figure 7:
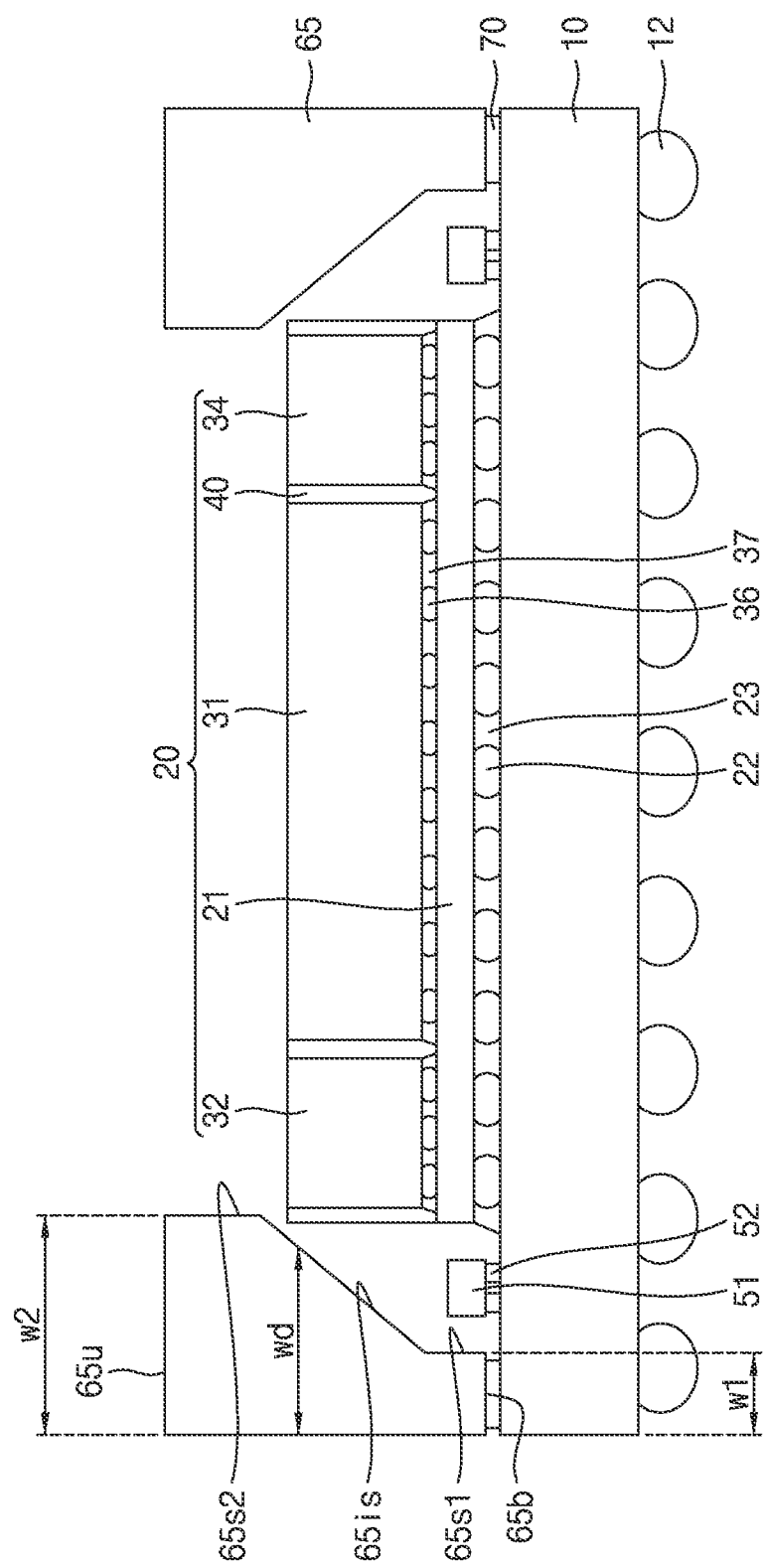
FIG. 7 is a cross-sectional view of a semiconductor package according to an example embodiment of the disclosure.

FIG. 7 is a cross-sectional view of a semiconductor package according to an example embodiment of the disclosure.

Referring to FIG. 7, a stiffener 65 may include a first vertical surface 65s1, an inclined surface 65is, and a second vertical surface 65s2. The first vertical surface 65s1 may be connected to a bottom surface 65b of the stiffener 65, and the second vertical surface 65s2 may be connected to a top surface 65u of the stiffener 65. In plan view, the second vertical surface 65s2 may be disposed nearer to a semiconductor stack 20 than the first vertical surface 65s1. The inclined surface 65is may extend from the first vertical surface 65s1 to the second vertical surface 65s2. The inclined surface 65is may have an inclination with respect to a top surface of a package substrate 10. The inclined surface 65*is* may vertically overlap with (i.e., extend over) a passive device 51. An upper end of the inclined surface 65*is* may be disposed at a higher level than a top surface of the semiconductor stack 20. A portion of the inclined surface 65*is* may vertically overlap with (i.e., extend over) a portion of the semiconductor stack 20.

A first minimum width w1 of the bottom surface 65*b* of the stiffener 65 may be smaller than a second minimum width w2 of the top surface 65*u* of the stiffener 65. A minimum width wd of a middle portion of the stiffener 65 may gradually increase as the middle portion of the stiffener 65 extends upwards with reference to the top surface of the package substrate 10. The middle portion of the stiffener 65 may mean a portion of the stiffener 65 disposed at a level higher than a lower end of the inclined surface 65*is*, but lower than the upper end of the inclined surface 65*is*.

In accordance with the example embodiments of the disclosure, it may be possible to reduce a coefficient of thermal expansion difference between a lower portion of a semiconductor package, at which a package substrate is disposed, and an upper portion of the semiconductor package, at which semiconductor chips are disposed, by increasing a portion of the semiconductor package occupied by a stiffener. In accordance with a reduction in coefficient of thermal expansion difference, a warpage phenomenon of the semiconductor package may be reduced.

While the embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:

1. A semiconductor package comprising:
   a package substrate;
   a semiconductor stack comprising an interposer substrate on the package substrate and semiconductor chips on the interposer substrate;
   a passive device on the package substrate and spaced apart from the semiconductor stack; and
   a stiffener on the package substrate, wherein the stiffener extends around an outer side of the semiconductor stack,
   wherein the stiffener comprises:
      at least one vertical or inclined surface;
      an uppermost inner side surface above the at least one vertical or inclined surface, extending to a top surface of the stiffener; and
      a first step surface below the at least one vertical or inclined surface, the first step surface extending over the passive device,
   wherein the uppermost inner side surface does not overlap the semiconductor chips in a vertical direction, and
   wherein a width of a bottom surface of the stiffener is smaller than a width of the top surface of the stiffener,
   wherein the stiffener extends over the semiconductor stack without contacting the semiconductor stack.

2. The semiconductor package according to claim 1, wherein the stiffener further comprises a second step surface at a higher level than the first step surface.

3. The semiconductor package according to claim 2, wherein the second step surface is at a higher level than a top surface of the semiconductor stack.

4. The semiconductor package according to claim 2, wherein the second step surface extends over the semiconductor stack.

5. The semiconductor package according to claim 2, wherein the second step surface does not extend over the semiconductor stack.

6. The semiconductor package according to claim 2, wherein the second step surface is closer to the semiconductor stack than the first step surface.

7. The semiconductor package according to claim 2, wherein:
   the stiffener further comprises a first vertical surface extending from the bottom surface to the first step surface; and
   the at least one vertical or inclined surface comprises a second vertical surface extending from the first step surface to the second step surface.

8. The semiconductor package according to claim 7, wherein the second vertical surface is closer to the semiconductor stack than the first vertical surface.

9. The semiconductor package according to claim 1, wherein the semiconductor stack comprises:
   an interposer substrate on the package substrate; semiconductor chips on the interposer substrate; and
   a mold layer extending around an outer side of the semiconductor chips on the interposer substrate.

10. A semiconductor package comprising:
    a package substrate;
    a semiconductor stack comprising an interposer substrate on the package substrate, semiconductor chips on the interposer substrate, and a mold layer extending around an outer side of the semiconductor chips;
    a passive device on the package substrate and spaced apart from the semiconductor stack;
    a stiffener on the package substrate, wherein the stiffener extends around an outer side of the semiconductor stack; and
    a thermal interface material (TIM) between the package substrate and the stiffener,
    wherein the stiffener comprises:
       at least one vertical or inclined surface;
       an uppermost inner side surface above the at least one vertical or inclined surface, extending to a top surface of the stiffener;
       a first step surface below the at least one vertical or inclined surface, the first step surface extending over the passive device; and
       a second step surface at a higher level than the first step surface,
    wherein the uppermost inner side surface overlaps the mold layer in a vertical direction, is spaced from the mold layer, and does not overlap the semiconductor chips in the vertical direction,
    wherein a portion of the second step surface overlaps the mold layer in the vertical direction, and is spaced from the mold layer, and
    wherein a width of a bottom surface of the stiffener is smaller than a width of the top surface of the stiffener.

11. The semiconductor package according to claim 10, wherein the stiffener includes copper (Cu) or an alloy thereof, and is configured as a monolithic structure of a single material.

12. The semiconductor package according to claim 10, wherein the second step surface is at a higher level than a top surface of the semiconductor stack.

13. The semiconductor package according to claim 10, wherein the at least one vertical or inclined surface comprises:
   a vertical surface extending to the top surface; and
   a first inclined surface extending from the vertical surface to the first step surface.

14. The semiconductor package according to claim 13, wherein an upper end of the first inclined surface is at a higher level than a top surface of the semiconductor stack.

15. The semiconductor package according to claim 13, wherein the stiffener further comprises a second inclined surface extending from the bottom surface to the first step surface, and wherein a portion of the first inclined surface extends over a portion of the semiconductor stack.

16. A semiconductor package comprising:
   a package substrate;
   a semiconductor stack comprising an interposer substrate on the package substrate, semiconductor chips on the interposer substrate, and a mold layer extending around an outer side of the semiconductor chips;
   a passive device on the package substrate and spaced apart from the semiconductor stack;
   a stiffener on the package substrate, wherein the stiffener extends around an outer side of the semiconductor stack; and
   a thermal interface material (TIM) between the package substrate and the stiffener,
   wherein the stiffener comprises
      at least one vertical or inclined surface comprising an inclined surface directly vertically overlapping the passive device,
      an uppermost inner side surface above the at least one vertical or inclined surface, extending to a top surface of the stiffener,
   wherein the uppermost inner side surface does not overlap the semiconductor chips in a vertical direction upward from a bottom surface of the stiffener, and
   wherein a portion of the stiffener gradually increases in width in the vertical direction,
   wherein the stiffener extends over the mold layer without contacting the mold layer.

17. The semiconductor package according to claim 16, wherein the stiffener further comprises:
   a step surface at a higher level than a top surface of the semiconductor stack.

18. The semiconductor package according to claim 17, wherein the step surface extends over the semiconductor stack.

19. The semiconductor package according to claim 16, wherein an upper end of the inclined surface is at a higher level than a top surface of the semiconductor stack.

20. The semiconductor package according to claim 16, wherein: the at least one vertical or inclined surface comprises
   a first vertical surface extending from the bottom surface of the stiffener; and the inclined surface extends from the first vertical surface to the uppermost inner side surface.

* * * * *